METHOD FOR PRODUCING A SEMICONDUCTOR ELEMENT
Filed Sept. 7, 1966
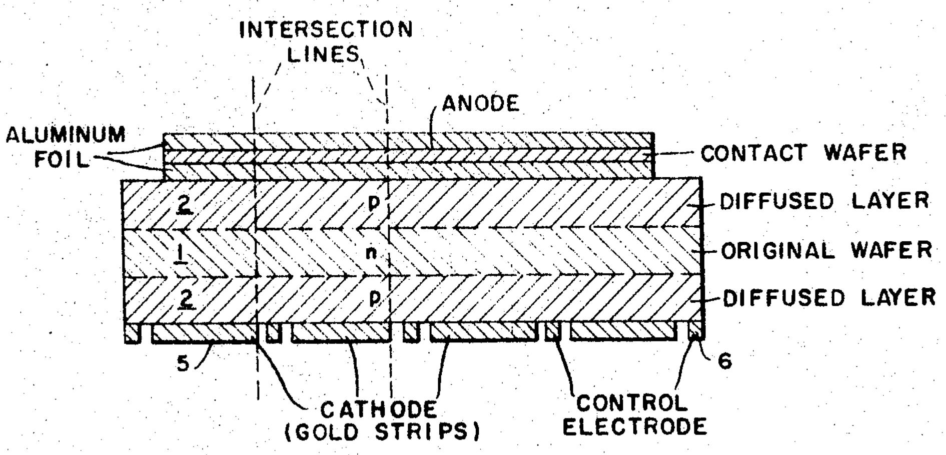
INVENTORS
Edgar Lutz
Johann Haserer &
Claus Pöhlau
BY Spencer & Kaye
ATTORNEYS 3,462,829
Patented Aug. 26, 1969

3,462,829

METHOD FOR PRODUCING A SEMICONDUCTOR ELEMENT

Edgar Lutz, Pliezhausen, Johann Haserer, Munich, and Claus Pöhlau, Nuremberg, Germany, assignors to Semikron Gesellschaft für Gleichrichterbau und Elektronik m.b.H., Nuremberg, Germany Filed Sept. 7, 1966, Ser. No. 577,755
Claims priority, application Germany, Sept. 8, 1965, S 99,297
Int. Cl. H01l *7/00, 1/14;* B01j *17/00*
U.S. Cl. 29—589 8 Claims

ABSTRACT OF THE DISCLOSURE

A method of making a large surface semiconductor element which can be divided into a plurality of small surface semiconductor elements, such as thyristors or the like, without damage to its layer structure. The method includes the steps of diffusing impurities into the two major surfaces of a semiconductor wafer having a first conductivity to form external layers having a second conductivity; placing, consecutively, a first aluminum foil, an anode contact wafer and a second aluminum foil on one of the major surfaces; placing cathode material strips having the first conductivity on the other of the major surfaces; and, in a single step, simultaneously alloying the first aluminum foil, the contact wafer and the second aluminum foil onto the one major surface, as well as the cathode material strips onto the other major surface.

The present invention relates generally to a method for producing semiconductor elements, and more particularly, to a method for producing semiconductor elements which are capable of withstanding the severe stresses to which they are subjected during the finishing process techniques into complete semiconductors.

In many known methods for the production of semiconductor elements, it is essential that the semiconductor element undergo severe temperatures while being made into complete semiconductor devices. A special case-hardenability is the most desired physical property which can only be produced by a particular technological method. The methods used for producing the element can also basically differ from each other.

For example, a semiconductor element which is produced completely by diffusion methods has different physical characteristics from that produced by alloying methods. The short time current or impact current as well as the load the surface could withstand depend on the processing methods. These are important characteristics of semiconductor elements.

Semiconductor elements produced by combining diffusion and alloying methods, such as thyristors can withstand larger impact currents and surface loads than equally sized elements produced solely by diffusion. Moreover, the mechanical strains and stresses which different semiconductor elements can withstand differ depending on the particular method for producing the element.

Advantageous processing methods for producing inexpensive small surface semiconductor elements have been sought for some time, as well as an apparatus for this purpose. In order to provide inexpensive small surface semiconductor elements, economical methods are necessary which can simultaneously produce a plurality of small surface semiconductor elements in a single operation.

"Large surface" semiconductor elements are understood as semiconductor elements having an average current of ten or more amperes and "small surface" semiconductor elements are understood as elements having an average current up to 10 amperes.

The processing methods that have so far been developed for producing large surface semiconductor elements provide that physical properties, desired for such semiconductors. However, for small surface semiconductor elements, other advantageous processing methods are needed.

Accordingly, it is an object of the present invention to provide a new and improved method for producing a semiconductor element.

A second object of the present invention is to provide a new and improved method for producing a semiconductor element in an inexpensive and economical manner.

A further object of the present invention is to provide a new and improved method for producing a semiconductor element which can withstand the severe mechanical and temperature stresses and strains necessary for fabricating a semiconductor device.

With the above objects in mind, the present invention mainly comprises a method for producing a semiconductor element particularly useful for refining small surface semiconductor elements and including, for example, a semiconductor material having an n-type conductivity. By a known diffusion method, a material having a p-type conductivity is diffused into the semiconductor material in both major surfaces thereof to produce a p-n-p structure. A contact wafer is alloyed to the anode side of the structure by means of an aluminum foil and on this wafer, which is capable of making contact, a further aluminum wafer is alloyed. At the same time, on the cathode side of the p-n-p structure, by means of an alloying process, a doped n conductivity gold foil is alloyed in strip form.

The single figure of the drawing is a schematic cross-sectional view of a semiconductor device constructed in accordance with the present invention.

The principles of the present invention can best be understood by reference to an example which is described as follows:

As an example of the invention, a silicon wafer having n-conductivity is used. This is made into a p-n-p structure by diffusing p-type impurities into both major surfaces of the wafer. One surface of the silicon wafer then has a contact member arranged thereon, for example, by means of an aluminum foil following a known method. Such a contact member arranged on the silicon wafer can be made from molybdenum, from tungsten or from other suitable known materials. A second aluminum foil may be alloyed to the outer surface of the contact member to make easier the subsequent contacting of this contact member.

That is, an aluminum wafer or foil can make contact at the surface of the silicon wafer corresponding to the anode side so that a p+ conductivity layer can be formed.

Simultaneously, with the alloying process at the anode side of the wafer, a second alloying step for providing strips at the cathode side can take place. Desirably, the control electrode and also the cathode itself can be strip shaped. The control electrode strips can be produced by alloying a contact material such as, for example, aluminum, while a doped n-type gold foil in strip shape can be used for the cathode. The control electrode strips and the cathode strips which have been produced by the alloying process are separated by selected distances in order to avoid a short circuit between the control electrode and the cathode.

In the above-described manner, with a single alloying process, it is possible to produce both the anode and the cathode as well as a control electrode for controllable semiconductor elements, such as a silicon controlled rectifier, for example.

The spaces between the doped gold foil strips on the cathode side of the wafer are sufficient for contacting the control electrode zone. Advantageously, the spaces between the strips of the gold foil are equal to each other and are a preselected amount. Similarly, the gold foil strips which are separated from each other by equal spaces can also be made in equal widths which, in each case, is greater than the spaces between the strips.

A semiconductor element produced in the above manner has advantageous properties for lattice structures as well as properties for surviving the thermal stresses produced during the contacting processes without damaging or changing the electrical properties of the material.

The method incorporating the principles of the present invention makes it possible to produce small surface semiconductor elements which will have no difficulty overcoming the stresses and strains to which they are subjected in the finishing processes.

In the particular example shown in the figure, an n-type silicon wafer 1 is made into a pnp-structure 2, 1, 2 by a well-known diffusion process. A first aluminum foil, a contact wafer, for example of molybdenum, tungsten or another suitable material and a second aluminum foil are consecutively arranged as an anode on one side of the pnp-type silicon wafer. On the other side of the pnp-wafer are placed strips of doped n-type gold foil 5 to form the cathodes and strips of aluminum in the spaces between the cathode strips to form the control electrodes 6. The entire structure so formed is then heated to the proper temperatures to simultaneously alloy the layers together. The large surface semiconductor element produced in this way includes a lot of small surface semiconductor elements. The small surface semiconductor elements are formed by intersecting or cutting the elements along lines such as those shown in the figure. For example even one strip of the cathode and one strip of the control electrode can determine the width of one small surface semiconductor element.

It will be understood that the above description of the present invention is susceptible to various modifications, changes, and adaptations, and the same are intended to be comprehended within the meaning and range of equivalents of the appended claims.

What is claimed is:

1. In a method of producing a semiconductor element from a wafer of semiconductor material having two major surface portions and having a first conductivity, the steps of:

(a) diffusing into both major surface portions of said semiconductor wafer impurities having a conductivity opposite to that of said first conductivity, one of said major surface portions being the anode side of the semiconductor element to be formed and the other major surface portion being the cathode side;

(b) placing a first aluminum foil on said anode side of said semiconductor wafer;

(c) placing an anode contact wafer on said first aluminum foil;

(d) placing a second aluminum foil on said anode contact wafer;

(e) placing cathode material strips having said first conductivity on said cathode side of said semiconductor wafer; and (f) simultaneously alloying said first aluminum foil, said anode contact wafer and said second aluminum foil on said anode side of said semiconductor wafer and said cathode material strips on said cathode side of said semiconductor wafer in a single step.

2. In a method of producing a semiconductor element in accordance with claim 1 wherein said strips are made from doped gold foil.

3. In a method of producing a semiconductor element in accordance with claim 1 wherein said first conductivity is n-type.

4. A method in accordance with claim 1 wherein the spacing between said strips on the cathode side of said semiconductor wafer is sufficient for contacting control electrode zones thereof.

5. A method in accordance with claim 1 wherein said anode contact wafer is made from molybdenum.

6. A method in accordance with claim 1 wherein said anode contact wafer is made from tungsten.

7. A method in accordance with claim 1 wherein said alloyed strips on the cathode side are spaced a preselected distance from each other.

8. A method in accordance with claim 7 wherein said alloyed strips are of equal width and are equidistant from each other and said strip width is larger than the space between the strips.

References Cited

UNITED STATES PATENTS

| | | | |
|---|---|---|---|
| 2,895,528 | 8/1959 | Patalong. | |
| 2,995,473 | 8/1961 | Levi. | |
| 3,228,104 | 1/1966 | Emeis | 29—589 X |
| 3,276,097 | 10/1966 | Cohen et al. | 29—590 X |
| 2,763,822 | 9/1956 | Frola et al. | |
| 3,299,487 | 1/1967 | Cook et al. | 29—589 |
| 2,960,640 | 11/1960 | Emeis. | |

PAUL M. COHEN, Primary Examiner

U.S. Cl. X.R.

29—591; 148—186